United States Patent
Madurawe et al.

(10) Patent No.: US 11,133,346 B2
(45) Date of Patent: Sep. 28, 2021

(54) STACKED-DIE IMAGE SENSORS WITH SHIELDING

(71) Applicant: SEMICONDUCTOR COMPONENTS INDUSTRIES, LLC, Phoenix, AZ (US)

(72) Inventors: Raminda Madurawe, Sunnyvale, CA (US); Richard Mauritzson, Meridian, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/729,713

(22) Filed: Dec. 30, 2019

(65) Prior Publication Data

US 2020/0135795 A1 Apr. 30, 2020

Related U.S. Application Data

(63) Continuation of application No. 15/155,245, filed on May 16, 2016, now Pat. No. 10,566,375.

(60) Provisional application No. 62/288,968, filed on Jan. 29, 2016.

(51) Int. Cl.
 *H01L 27/146* (2006.01)
 *H01L 25/04* (2014.01)

(52) U.S. Cl.
 CPC ...... *H01L 27/14643* (2013.01); *H01L 25/043* (2013.01); *H01L 27/14623* (2013.01); *H01L 27/14625* (2013.01); *H01L 27/14636* (2013.01)

(58) Field of Classification Search
 CPC ............. H01L 27/14643; H01L 25/043; H01L 27/14623; H01L 27/14625;

(Continued)

(56) References Cited

U.S. PATENT DOCUMENTS 7,446,357 B2  11/2008 Mckee
8,466,402 B2   6/2013 Wan et al.
(Continued)

OTHER PUBLICATIONS

Wimgplinger et al., "Hybrid Wafer Level Bonding for 3D IC: An Equipment Perspective", SEMICON Europa 2014, 24 pages, Retrieved from the Internet: <URL:http://www.semieurope.omnibooksonline.com/2014/semicon_europa/SEMICON_TechARENA_presentations/TechARENA1/3D%20Integration%20Session%20and%20Exhibitor%20Presentations/04_Thorsten%20Matthias_EVG.pdf> [Retrieved on Jan. 28, 2016].

(Continued)

*Primary Examiner* — Samuel Park
(74) *Attorney, Agent, or Firm* — Treyz Law Group, P.C.; Tianyi He

(57) ABSTRACT

A stacked-die image sensor may be provided with an array of image pixels. The stacked-die image sensor may include at least first and second integrated circuit dies stacked on top of one another. Some of the pixel circuitry in each pixel may be formed in the first integrated circuit die and some of the pixel circuitry in each pixel may be formed in the second integrated circuit die. Coupling structures such as conductive pads may electrically couple the pixel circuitry in the first integrated circuit die to the pixel circuitry in the second integrated circuit die. A shielding structure may partially or completely surround each conductive pad to reduce parasitic capacitive coupling between adjacent conductive pads. The shielding structure may be a metal wire coupled to a ground voltage. The shielding structure may extend between columns of image pixels and/or between rows of image pixels.

8 Claims, 11 Drawing Sheets

(58) Field of Classification Search
CPC ..... H01L 27/14636; H01L 2924/00014; H01L 2927/00; H01L 2924/00012; H01L 27/1464; H01L 2224/48227; H01L 2224/73265; H01L 27/14627; H01L 27/14609; H01L 21/00; H01L 21/70; H01L 21/746; H01L 21/7624; H01L 21/76297; H01L 21/77; H01L 21/82; H01L 21/8221; H01L 23/50; H01L 27/01; H01L 27/0203; H01L 27/0605; H01L 27/0611; H01L 27/0688; H01L 2924/00; H01L 27/146; H01L 25/167; H01L 27/3227; H01L 31/02024; H01L 31/0203; H01L 31/0284; H01L 31/1032; H01L 31/107

See application file for complete search history.

(56) References Cited

U.S. PATENT DOCUMENTS

| | | |
|---|---|---|
| 8,637,800 B2 | 1/2014 | Kozlowski |
| 9,113,103 B2 | 8/2015 | Matsuda et al. |
| 2006/0175536 A1* | 8/2006 | Kim ................. H01L 27/14609 250/208.1 |
| 2007/0170517 A1 | 7/2007 | Furukawa et al. |
| 2008/0203313 A1 | 8/2008 | Harrison et al. |
| 2009/0201400 A1 | 8/2009 | Zhang et al. |
| 2010/0060764 A1 | 3/2010 | McCarten et al. |
| 2010/0140732 A1 | 6/2010 | Eminoglu et al. |
| 2010/0245648 A1 | 9/2010 | Tayanaka et al. |
| 2013/0092820 A1* | 4/2013 | Takemoto ......... H01L 27/14634 250/208.1 |
| 2013/0284885 A1* | 10/2013 | Chen ................. H01L 27/14621 250/208.1 |
| 2015/0194455 A1* | 7/2015 | Ho ......................... H01L 25/50 257/460 |
| 2015/0326811 A1* | 11/2015 | Nishida .................... H03K 4/08 348/308 |

OTHER PUBLICATIONS

Di Cioccio et al., "An Overview of Patterned Metal/Dielectric Surface Bonding: Mechanism, Alignment and Characterization", Journal of the Electrochemical Society, Apr. 15, 2011, 14 pages.

* cited by examiner

STACKED-DIE IMAGE SENSORS WITH SHIELDING

This application is a continuation of U.S. patent application Ser. No. 15/155,245, filed on May 16, 2016, which claims the benefit of U.S. Provisional Patent Application No. 62/288,968, filed on Jan. 29, 2016. U.S. patent application Ser. No. 15/155,245 and U.S. Provisional Patent Application No. 62/288,968 are hereby incorporated by reference herein in their entireties.

BACKGROUND

This relates generally to imaging systems and, more particularly, to stacked-die image sensors with split-pixel architecture.

Modern electronic devices such as cellular telephones, cameras, and computers often use digital image sensors. Imager sensors (sometimes referred to as imagers) may be formed from a two-dimensional array of image sensing pixels. Each pixel includes a photosensitive layer that receives incident photons (light) and converts the photons into electrical signals. Image sensors are sometimes designed to provide images to electronic devices using a Joint Photographic Experts Group (JPEG) format.

As electronic devices become smaller, more electronic devices are using "stacked" image sensors in which multiple integrated circuit wafers (or multiple individual die) are stacked on top of one another. Conductive interconnects that include metal wires, pads or vias are used to electrically connect the circuitry in one die to the circuitry in another die.

In conventional stacked-die image sensors, parasitic capacitive coupling may occur between adjacent conductive interconnects, thereby causing electrical crosstalk. This type of electrical crosstalk between adjacent pixels may lead to image artifacts and degraded image quality.

It would therefore be desirable to provide improved conductive interconnect arrangements for stacked-die image sensors.

DETAILED DESCRIPTION

Embodiments of the present invention relate to image sensors with pixels. The image sensors may be stacked-die image sensors in which multiple integrated circuit dies are stacked on top of one another. Pixels in a stacked-die image sensor may have split-pixel architecture in which the pixel circuitry of each pixel is split into multiple dies in the stacked-die arrangement. For example, a pixel may include some circuitry in a lower die and some circuitry in an upper die that is stacked on top of the lower die. Interconnect coupling structures may be used to electrically connect the circuitry in one die to the circuitry in another die. To reduce parasitic coupling and/or cross-talk between adjacent pixels, an isolation structure may be formed between the interconnect elements within a pixel or between an adjacent pair of pixels.

Figure 1:
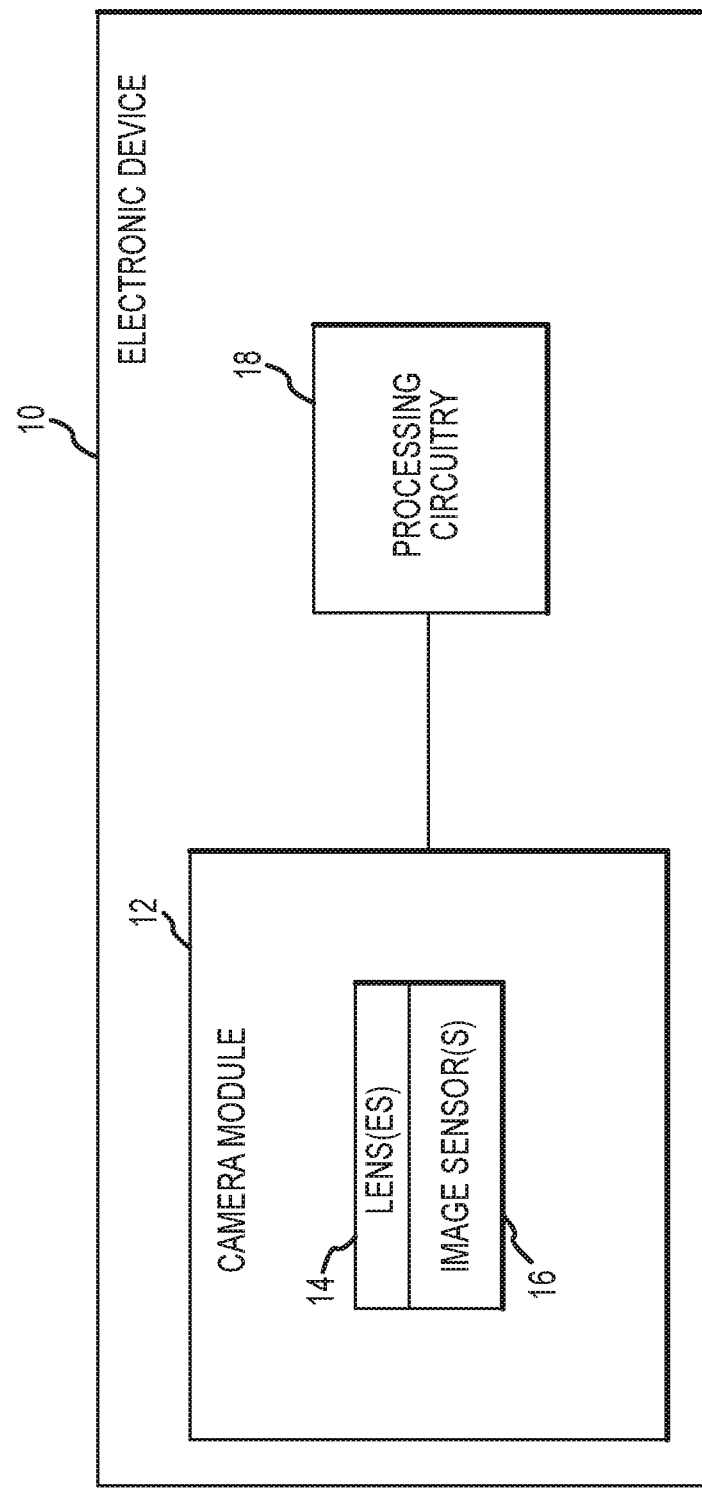
FIG. 1 is a schematic diagram of an illustrative electronic device that may include an image sensor in accordance with an embodiment of the present invention.

An illustrative electronic device that may include a stacked-die image sensor with split-pixel architecture is shown in FIG. 1. Electronic device 10 may be a digital camera, a computer, a cellular telephone, a medical device, or other electronic device. Camera module 12 (sometimes referred to as an imaging device) may include image sensor 16 and one or more lenses 14. During operation, lenses 14 focus light onto image sensor 16. Image sensor 16 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 16 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 16 may be provided to processing circuitry 18. Processing circuitry 18 may be used to perform image processing functions such as automatic focusing functions, depth sensing, data formatting, adjusting white balance and exposure, implementing video image stabilization, face detection, etc.

Processing circuitry 18 may also be used to compress raw camera image files if desired (e.g., to Joint Photographic Experts Group or JPEG format). In a typical arrangement, which is sometimes referred to as a system on chip (SOC) arrangement, image sensor 16 and processing circuitry 18 are implemented on a common integrated circuit. The use of a single integrated circuit to implement image sensor 16 and processing circuitry 18 can help to reduce costs. This is, however, merely illustrative. If desired, image sensor 16 and processing circuitry 18 may be implemented using separate integrated circuits. Processing circuitry 18 may include microprocessors, microcontrollers, digital signal processors, application specific integrated circuits, or other processing circuits.

Figure 2:
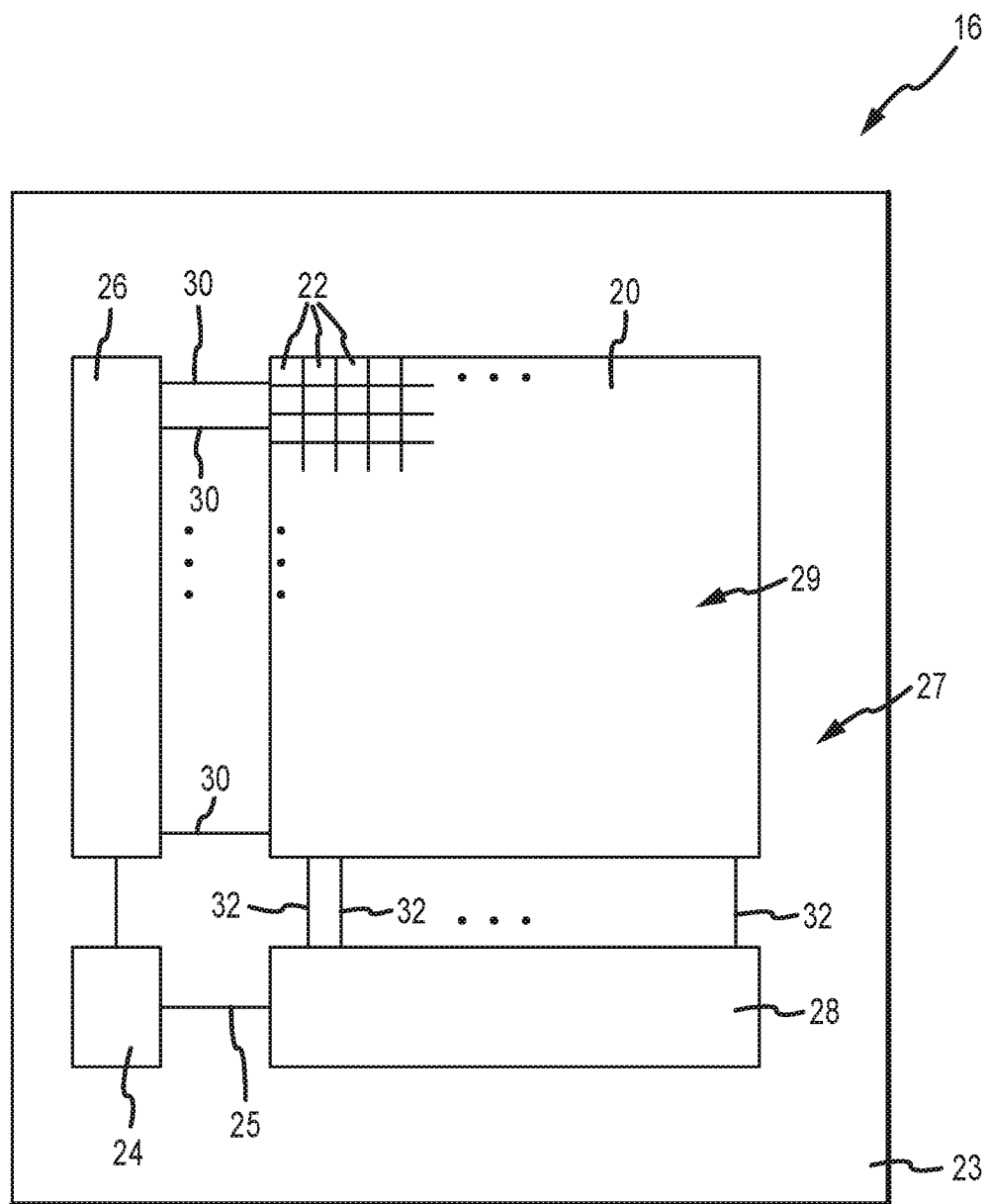
FIG. 2 is a diagram of an illustrative pixel array and associated readout circuitry for reading out image signals from the pixel array in accordance with an embodiment of the present invention.

As shown in FIG. 2, image sensor 16 may include pixel array 20 containing image sensor pixels 22 arranged in rows and columns (sometimes referred to herein as image pixels or pixels) and control and processing circuitry 24 (which may include, for example, image signal processing circuitry). Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry).

Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

Figure 3:
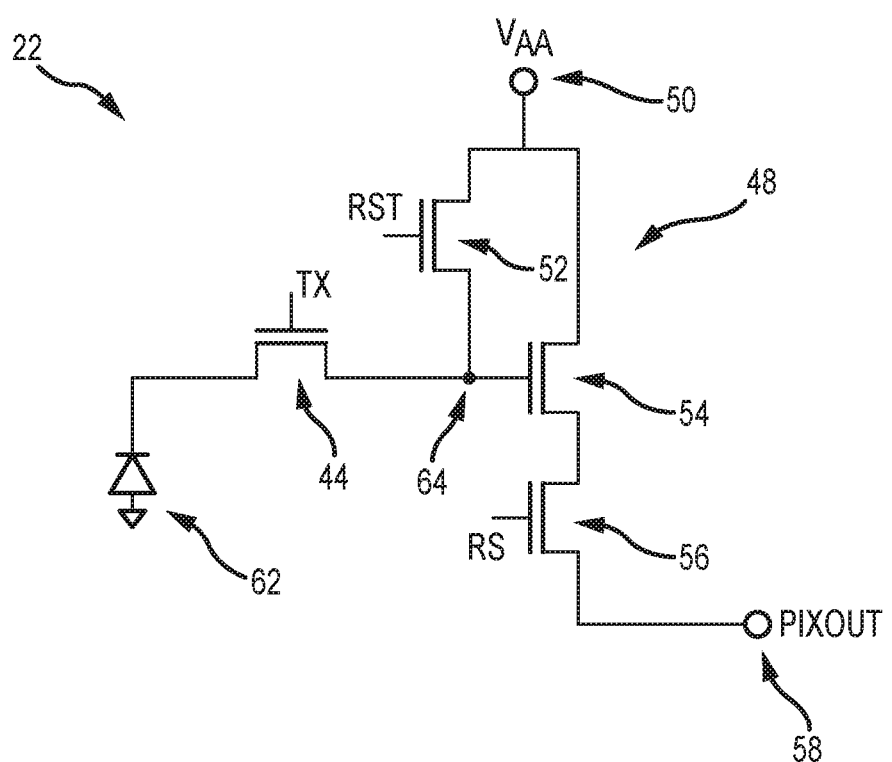
FIG. 3 is a circuit diagram of an illustrative pixel that may be used in a pixel array of the type shown in FIG. 2 in accordance with an embodiment of the present invention.

Pixel circuitry 48 in an illustrative image pixel 22 of image sensor 16 is shown in FIG. 3. As shown in FIG. 3, pixel 22 includes a photosensitive element such as photodiode 62. Pixel circuitry 22 may also include components such as transfer transistor 44, reset transistor 52, floating diffusion node 64, source follower transistor 54, row select transistor 56, bias voltage supply line 50, or pixel output line 58. Storage diodes may also be used to store photodiode charge before readout. A bias voltage (e.g., voltage $V_{AA}$) may be supplied to bias voltage supply line 50. Incoming light is collected by photodiode 62 after passing through a color filter structure. Photodiode 62 converts the light to electrical charge.

After an image is acquired, reset control signal RST may be asserted. This turns on reset transistor 52 and resets floating diffusion node 64 to $V_{AA}$. The reset control signal RST may then be deasserted to turn off reset transistor 52. After the reset process is complete, transfer gate control signal TX may be asserted to turn on transfer transistor 44. When transfer transistor 44 is turned on, the charge that has been generated by photodiode 62 in response to incoming light is transferred to floating diffusion node 64.

Floating diffusion node 64 may include a region of doped semiconductor (e.g., a doped silicon region formed in a silicon substrate by ion implantation, impurity diffusion, or other doping techniques). Floating diffusion node 64 may include a conductive interconnect region (formed by deposition and etching techniques). The floating diffusion FD (i.e. doped semiconductor region and interconnects) exhibits a capacitance that can be used to store the charge that has been transferred from photodiode 62. The signal associated with the stored charge on node 64 is conveyed to row select transistor 56 by source follower transistor 54. In other embodiments, the photodiode charge may be first transferred to an intermediate storage diode, and then transferred to the floating diffusion node 64.

When it is desired to read out the value of the stored charge, row select control signal RS can be asserted. When signal RS is asserted, row select transistor 56 turns on and a corresponding signal PIXOUT that is representative of the magnitude of the charges on floating diffusion node 64 is produced on pixel output line 58. In a typical configuration, there are numerous rows and columns of pixels such as pixel 22 in the image sensor pixel array of a given image sensor. When signal RS is asserted in a given row, pixel output line 58 can be used to route signal PIXOUT from that row to readout circuitry.

Pixel 22 may have a split-pixel architecture in which some components of pixel 22 are formed in a first die and other components of pixel 22 are formed in a second die that is stacked on top of or below the first die. For example, transfer transistor 44 and floating diffusion node 64 may be formed in a first die and reset transistor 52, source follower transistor 54 and row select transistor 58 may be formed in a second die. This example is merely illustrative, however. In general, pixel circuitry may be split between multiple dies in any desired manner. Pixel 22 may also include additional circuitry not shown in FIG. 3. For example, pixel 22 may include a split floating diffusion node (e.g., a first floating diffusion in a first die and a second floating diffusion in a second die) and/or may include two bias voltage supply lines (e.g., a first bias voltage supply line in a first die and a second bias voltage supply line in a second die). Illustrative examples of how pixel circuitry in each pixel 22 may be split among multiple stacked dies are described below.

Figure 4:
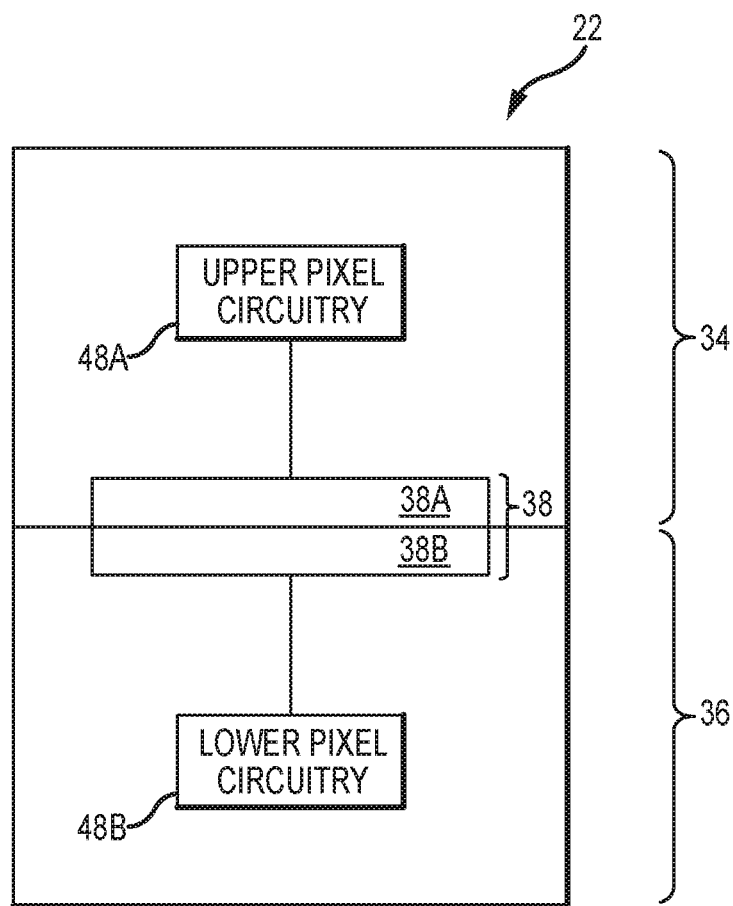
FIG. 4 is a schematic diagram of an illustrative pixel of the type shown in FIG. 3 in which pixel circuitry is split among multiple stacked layers in accordance with an embodiment of the present invention.

A schematic diagram of an illustrative split-circuitry image pixel 22 is shown in FIG. 4. Pixel circuitry of pixel 22 may be split among multiple integrated circuit layers such as upper integrated circuit layer 34 and lower integrated circuit layer 36. Upper and lower integrated circuit layers 34 and 36 may be individual integrated circuit dies (sometimes referred to as image sensor dies, integrated circuit dies, or dies) or may be wafers that each include multiple individual integrated circuits. Arrangements in which upper integrated circuit layer 34 is an individual integrated circuit die and lower integrated circuit layer 36 is an individual integrated circuit die are sometimes described herein as an illustrative example. As shown in FIG. 4, upper die 34 includes upper pixel circuitry 48A and lower die 36 includes lower pixel circuitry 48B. Upper pixel circuitry 48A may include some of pixel circuitry 48 of FIG. 3, while lower pixel circuitry 48B may include the remaining pixel circuitry 48 of FIG. 3. If desired, additional pixel circuitry not shown in FIG. 3 may be included in pixel circuitry 48A and/or pixel circuitry 48B.

A coupling structure such as coupling structure 38 may be used to electrically couple upper pixel circuitry 48A in upper die 34 to lower pixel circuitry 48B in lower die 36. Coupling structure 38 may be a single conductive structure or may be formed from multiple conductive structures that have been bonded together such as upper conductive structure 38A and lower conductive structure 38B. Coupling structure 38 (sometimes referred to as a conductive pad, a micro-pad, a conductive interconnect structure, or a conductive via) may be formed from metal such as copper, aluminum, silver, gold, tungsten, or any other suitable conductive material.

Upper and lower dies 34 and 36 may each include a semiconductor layer (e.g., formed from crystalline silicon or any other suitable semiconductor material) and a dielectric layer (e.g., an interlayer dielectric layer formed from oxide or other dielectric material). Upper pixel circuitry 48A and lower pixel circuitry 48B may include conductive vias (such as vias 66A and 66B shown in FIG. 6), signal traces, and regions of doped semiconductor material. Control signals and image data may be conveyed between upper die 34 and lower die 36 using coupling structure 38. For example, pixel signals may be transferred from a photodiode in upper pixel circuitry 48A to readout circuitry in lower pixel circuitry 48B via coupling structure 38.

The example of FIG. 4 in which only two integrated circuit layers (34 and 36) are shown is merely illustrative. If desired, image sensor 16 may include three, four, five, or more than five integrated circuit layers that are stacked on top of one another. For example, a third integrated circuit die may be stacked above or below dies 34 and 36 and may include analog and digital image sensor circuitry. This is, however, merely illustrative. If desired, analog and digital image sensor circuitry may be contained within one or both of pixel circuitry dies 34 and 36 and a third die may be omitted.

Figure 5:
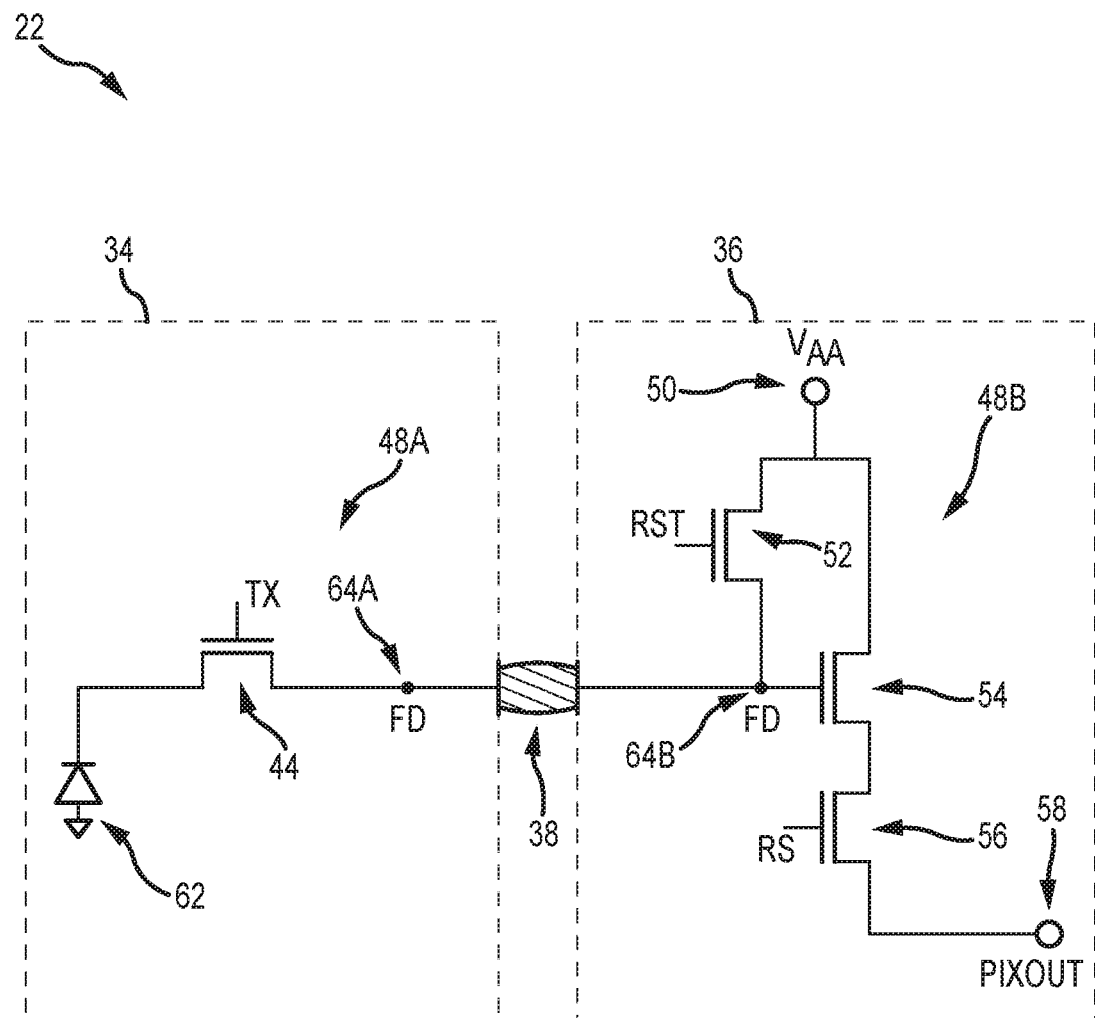
FIG. 5 is a circuit diagram of an illustrative pixel in which a first floating diffusion region is in a first layer and a second floating diffusion region, a reset transistor, a source follower transistor, and a row select transistor are in a second layer in accordance with an embodiment of the present invention.

FIG. 5 shows an illustrative example of how pixel circuitry may be split up among first and second layers. In the example of FIG. 5, upper pixel circuitry 48A in upper die 34 may include photodiode 62, transfer transistor 44, and upper floating diffusion node 64A, while lower pixel circuitry 48B in lower die 36 may include lower floating diffusion node 64B, reset transistor 52, source follower transistor 54, bias voltage supply line 50, row select transistor 56, and pixel output line 58. Coupling structure 38 may electrically couple upper pixel circuitry 48A to lower pixel circuitry 48B. In the example of FIG. 5, coupling structure 38 is coupled between upper floating diffusion node 64A and lower floating diffusion node 64B. Charge that is transferred from photodiode 62 is shared between upper floating diffusion node 64A and lower floating diffusion node 64B. Lower floating diffusion node 64B with both nodes reaching a common equilibrium voltage level is coupled to the gate terminal of source follower transistor 54.

Figure 6:
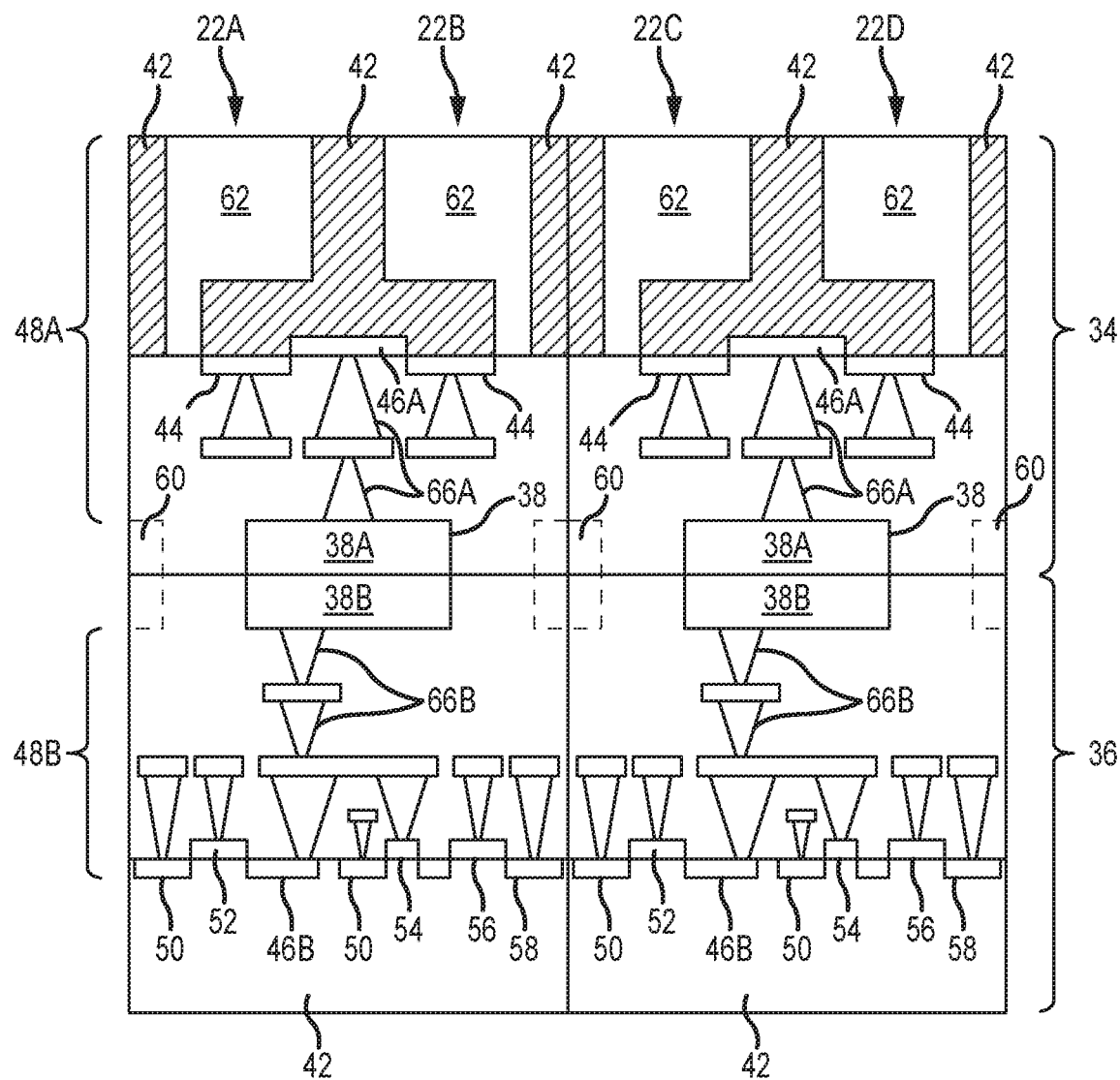
FIG. 6 is a cross-sectional side view of illustrative pixels of the type shown in FIG. 5 in accordance with an embodiment of the present invention.

FIG. 6 is a cross-sectional side view of illustrative pixels 22A, 22B, 22C, and 22D that have split circuitry of the type shown in FIG. 5. Each pixel 22 may be formed from an upper die 34 and a lower die 36. Upper die 34 may include photosensitive regions 62 (e.g., photodiodes). Each photosensitive region 62 may be surrounded by isolation layer 42, which may prevent accumulated charge from leaking to adjacent photosensitive regions 62. Upper die 34 may also include upper pixel circuitry 48A, such as transfer transistor 44 and upper floating diffusion region 46A. Upper pixel circuitry 48A may further include conductive interconnect structures such as vias 66A or metal traces. Each photosensitive region 62 may be adjacent to a transfer transistor 44 and upper floating diffusion region 46A. If desired, each upper floating diffusion region 46A may be shared between multiple pixels 22. In the example of FIG. 6, pixels 22A and 22B share a single upper floating diffusion region 46A, and pixels 22C and 22D share a different upper floating diffusion region 46A.

Lower die 36 may include lower pixel circuitry 48B, such as bias voltage supply line 50 (Vaa), reset transistor 52 (RST), lower floating diffusion region 46B, source follower transistor 54 (SF), row select transistor 56 (RS), and pixel output line 58. Lower pixel circuitry 48B may also include conductive interconnect structures, such as vias 66B or conductive traces, which may be formed from metal and may be used to couple components in lower die 36 to other components. In the illustrative example of FIG. 6, pixels 22A and 22B may share a single set of lower pixel circuitry 48B and pixels 22C and 22D may share a different set of lower pixel circuitry 48B. An additional isolation layer 42 may be formed in lower die 36.

Upper die 34 may also include metal pad 38A and lower die 36 may also include metal pad 38B. Upper die 34 and lower die 36 may be bonded to each other such that metal pad 38A and metal pad 38B are bonded together and are electrically coupled. If desired, metal pads 38A and 38B may be compression bonded to each other. However, this is merely illustrative. If desired, metal pads 38A and 38B may be bonded together using any known metal-to-metal bonding technique, such as soldering or welding. Upper pixel circuitry 48A may include conductive interconnect structures such as vias 66A, which may be used to electrically couple upper floating diffusion region 46A to metal pad 38A. Lower pixel circuitry 48B may also include conductive interconnect structures such as vias 66B, which may be used to electrically couple lower floating diffusion region 46B to metal pad 38B. Vias 66A and 66B in pixel circuitry 48 may be formed from metal deposited within upper and lower dies 34 and 36. However, this is merely illustrative. If desired, vias 66A and 66B may be formed from regions of doped semiconductor or may be formed from any other suitable conductive material.

When metal pads 38A and 38B are bonded together, upper die 34 and lower die 36 may be electrically coupled to each other via metal pad 38. In the illustrative example of FIG. 6, upper floating diffusion region 46A may be electrically coupled to lower floating diffusion region 46B through metal pad 38 and the conductive interconnect structures formed in upper pixel circuitry 48A and the conductive interconnect structures formed in lower pixel circuitry 48B. As described in connection with FIG. 3, during readout of pixel 22, when transfer transistor 44 is turned on, the charge that has been generated by photosensitive region 62, in response to incoming light, is transferred to upper floating diffusion region 46A. The transferred charge is shared among upper pixel circuitry 48A, metal pad 38, lower pixel circuitry 48B, and lower floating diffusion region 46B, which are all electrically coupled to upper floating diffusion region 46A.

In the illustrative example of FIG. 6, pixels 22A and 22B may share a first upper floating diffusion region 46A, a first upper pixel circuitry 48A, a first metal pad 38, and first lower pixel circuitry 48B. Pixels 22C and 22D may share a second upper floating diffusion region 46B, a second upper pixel circuitry 48A, a second metal pad 38, and second lower pixel circuitry 48B. During readout of pixel 22A, charge may be transferred from the photosensitive region 62 of pixel 22A to the first upper floating diffusion region 46A. This charge may then be shared among the first upper pixel circuitry 48A, the first metal pad 38, and some components of the first lower pixel circuitry 48B. If desired, pixel 22C may be readout at the same time as pixel 22A. During the readout of pixel 22C, charge may be transferred from the floating diffusion region 62 of pixel 22C to the second upper floating diffusion region 46A. This charge may then be shared among the second upper pixel circuitry 48A, the second metal pad 38, and some components of the second lower pixel circuitry 48B.

During readout operations, charge from photosensitive regions 62 in upper die 34 may be transferred to lower die 36 via coupling structures 38. If care is not taken, adjacent coupling structures 38 (e.g., a first coupling structure 38 associated with pixels 22A and 22B and a second coupling structure 38 associated with pixels 22C and 22D) can interact with one another during readout operations. This type of undesired parasitic coupling can result in unwanted artifacts, such as electrical cross-talk, and degraded pixel performance. To prevent parasitic coupling between adjacent coupling structures 38, shielding structures may be formed between adjacent coupling structures 38. As shown in FIG. 6, for example, shieling structure 60 may be formed between the coupling structure 38 of pixels 22A and 22B and the coupling structure 38 of pixels 22C and 22D. Shielding structure 60 may be formed from metal such as copper, aluminum, gold, silver, or any other desired conductive material such as doped polysilicon. Shielding structure 60 may be formed using the same material as coupling structure 38. If desired, shielding 60 may be coupled to an electrical wire that is held at a desired voltage such as a ground voltage or power supply voltage. As shown in FIG. 6, shielding 60 may be formed in both the upper die 34 and lower die 36. This is merely illustrative, however. If desired, shielding structure 60 may be formed in only the upper die 34, only the lower die 36, or it may be omitted.

Figure 7:
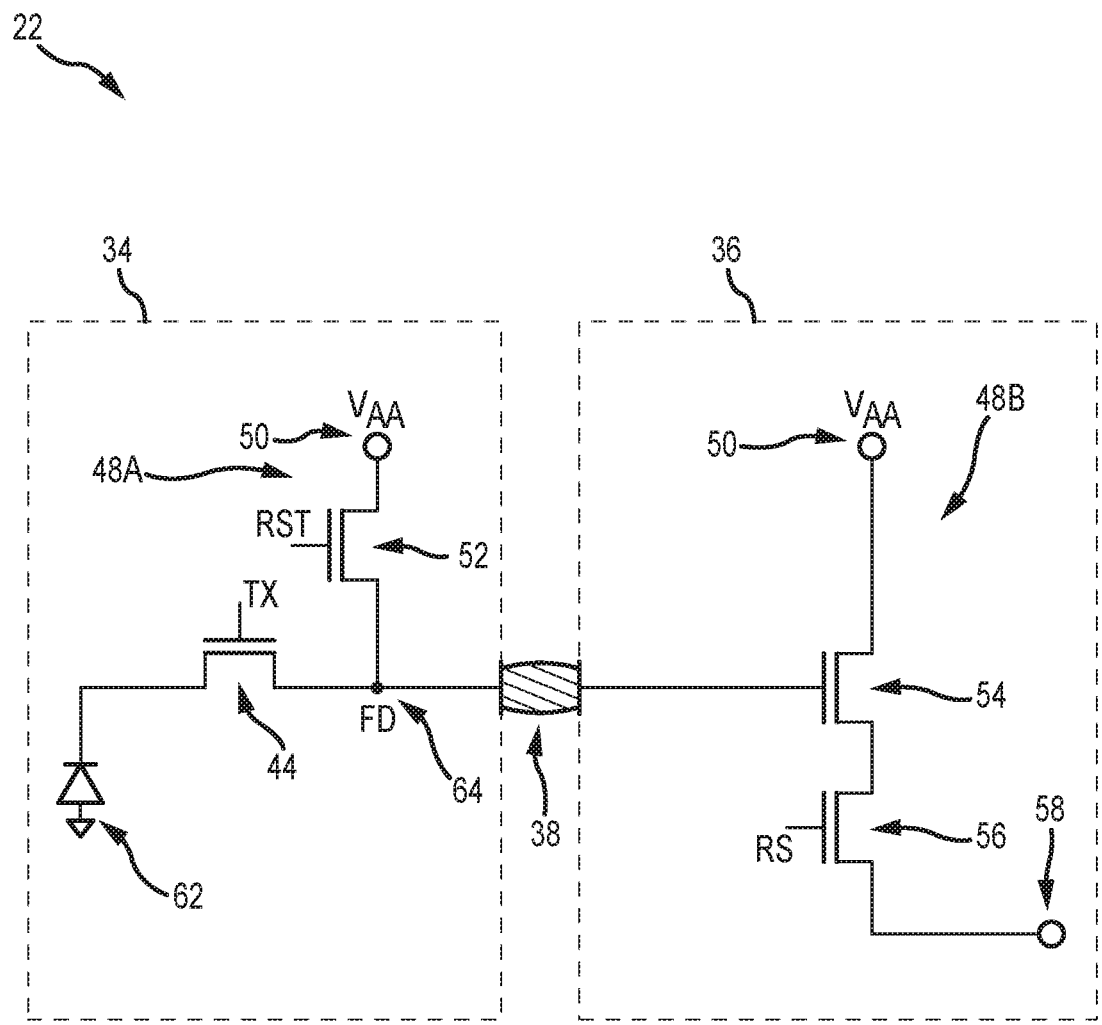
FIG. 7 is a circuit diagram of an illustrative pixel in which a floating diffusion region and a reset transistor are in a first layer and a source follower transistor and row select transistor are in a second layer in accordance with an embodiment of the present invention.

FIG. 7 shows another illustrative example of how pixel circuitry 48 of pixel 22 may be split among multiple dies. In the illustrative example of FIG. 7, photodiode 62, transfer transistor 44, floating diffusion node 64, reset transistor 52, and a bias voltage supply line 50 are formed in upper die 34 while source follower transistor 54, a bias voltage supply line 50, row select transistor 56, and pixel output line 58 are formed in lower die 36. Charge generated in photodiode 62 may be stored in floating diffusion node 64, which is coupled to the gate terminal of source follower transistor 54 via metal pad 38.

Figure 8:
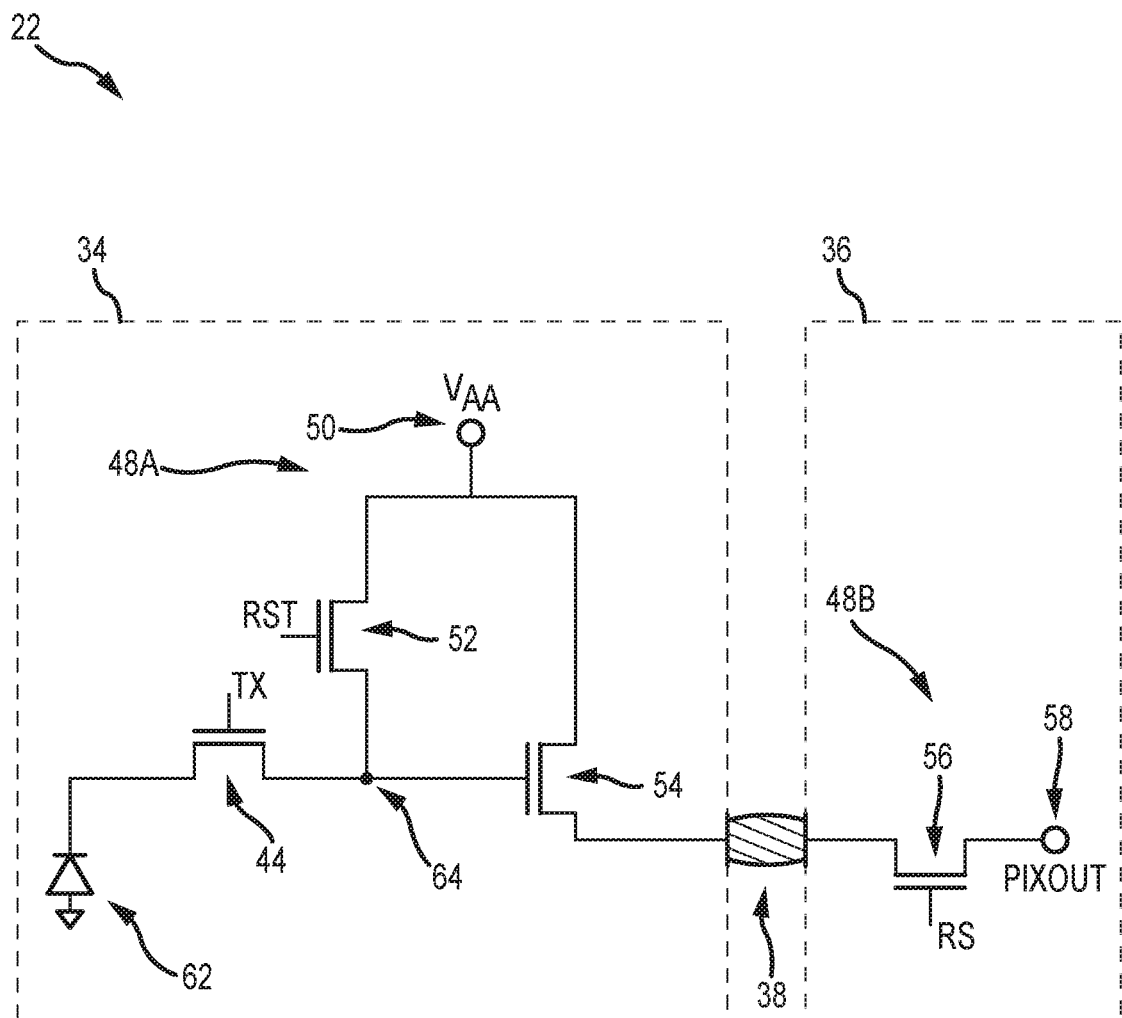
FIG. 8 is a circuit diagram of an illustrative pixel in which a floating diffusion region, a reset transistor and a source follower transistor are in a first layer and a row select transistor is located in a second layer in accordance with an embodiment of the present invention.

FIG. 8 shows another illustrative example of how pixel circuitry 48 of pixel 22 may be split among multiple dies. In the example of FIG. 8, photodiode 62, transfer transistor 44, floating diffusion node 64, reset transistor 52, bias voltage supply line 50, and source follower transistor 54 are formed in upper die 34 while row select transistor 56 and pixel output line 58 are formed in lower die 36. Charge generated in photodiode 62 may be stored in floating diffusion node 64. The signal associated with the stored charge on node 64 in upper die 34 is conveyed to row select transistor 56 in lower die 36 by source follower transistor 54. The signal may be transferred from source follower transistor 54 to row select transistor 56 through coupling structure 38, which can then be read out when signal RS is asserted. If desired, additional pixel circuitry not shown in FIG. 8 (such as circuitry to support in-pixel correlated double sampling) may be included in the pixel circuitry on lower die 36.

Figure 9:
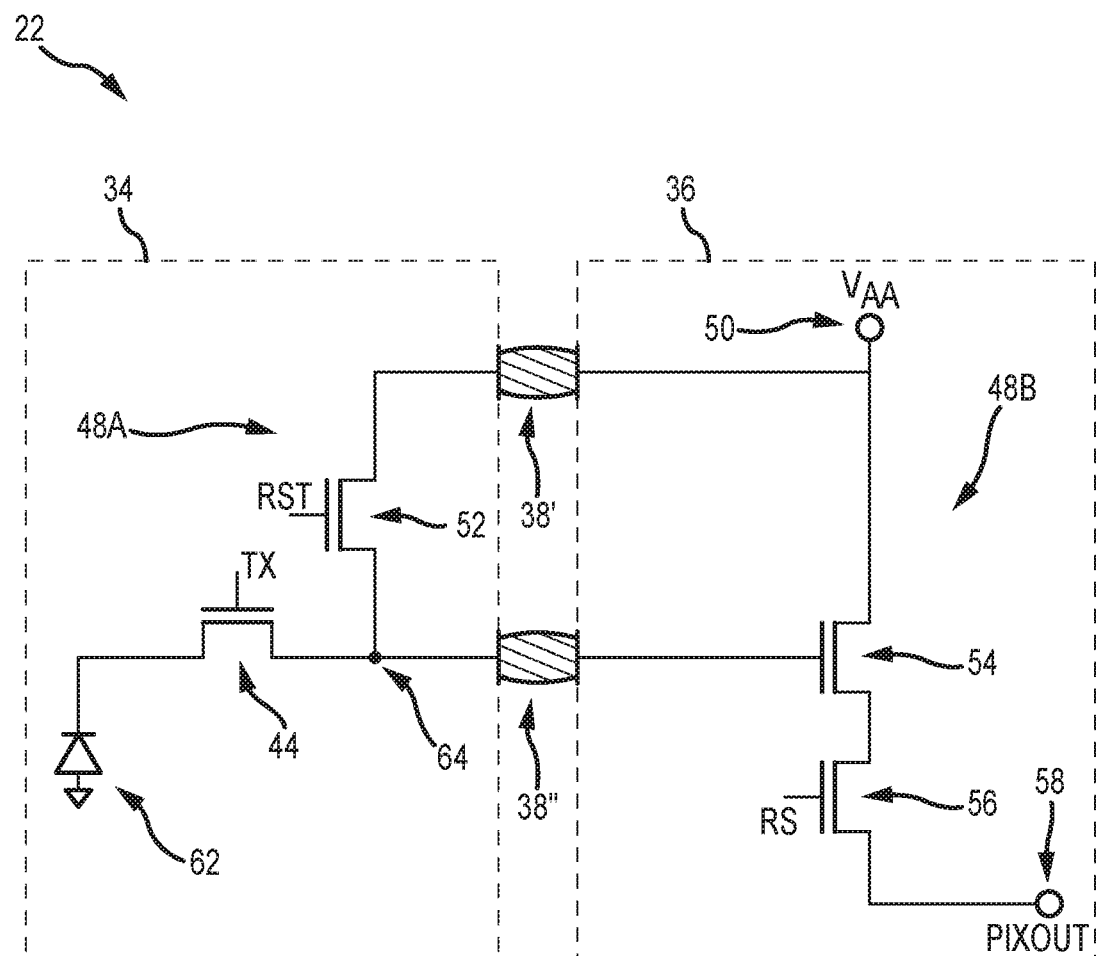
FIG. 9 is a circuit diagram of an illustrative pixel in which a floating diffusion region and a reset transistor are in a first layer and a source follower transistor and row select transistor are in a second layer in accordance with an embodiment of the present invention.

FIG. 9 shows another illustrative example of how pixel circuitry 48 of pixel 22 may be split among multiple dies. In the example of FIG. 9, photodiode 62, transfer transistor 44, floating diffusion node 64, and reset transistor 52 are formed in upper die 34 while bias voltage supply line 50, source follower transistor 54, row select transistor 56, and pixel output line 58 are formed in lower die 36. Electrical signals may be conveyed between upper pixel circuitry 48A and lower pixel circuitry 48B using multiple coupling structures 38. As shown in FIG. 9, for example, first coupling structure 38' may be electrically coupled between bias voltage supply line 50 and reset transistor 52, while second coupling structure 38" may be electrically coupled between floating diffusion node 64 and source follower transistor 54. Bias voltage $V_{AA}$ may be supplied from bias voltage supply line 50 to reset transistor 52 through coupling structure 38'. The signal associated with the stored charge on node 64 in upper die 34 is conveyed to source follower transistor 54 in lower die 36 via coupling structure 38". Source follower transistor 54 may convey the signal to row select transistor 56, which can then be read out when signal RS is asserted. Alternatively, first coupling structure 38' may be formed as a ring surrounding the second coupling structure 38". In this arrangement, the first coupling structure 38' that is coupled to $V_{AA}$ is the isolation structure 60 that prevents electrical cross-talk.

Figure 10:
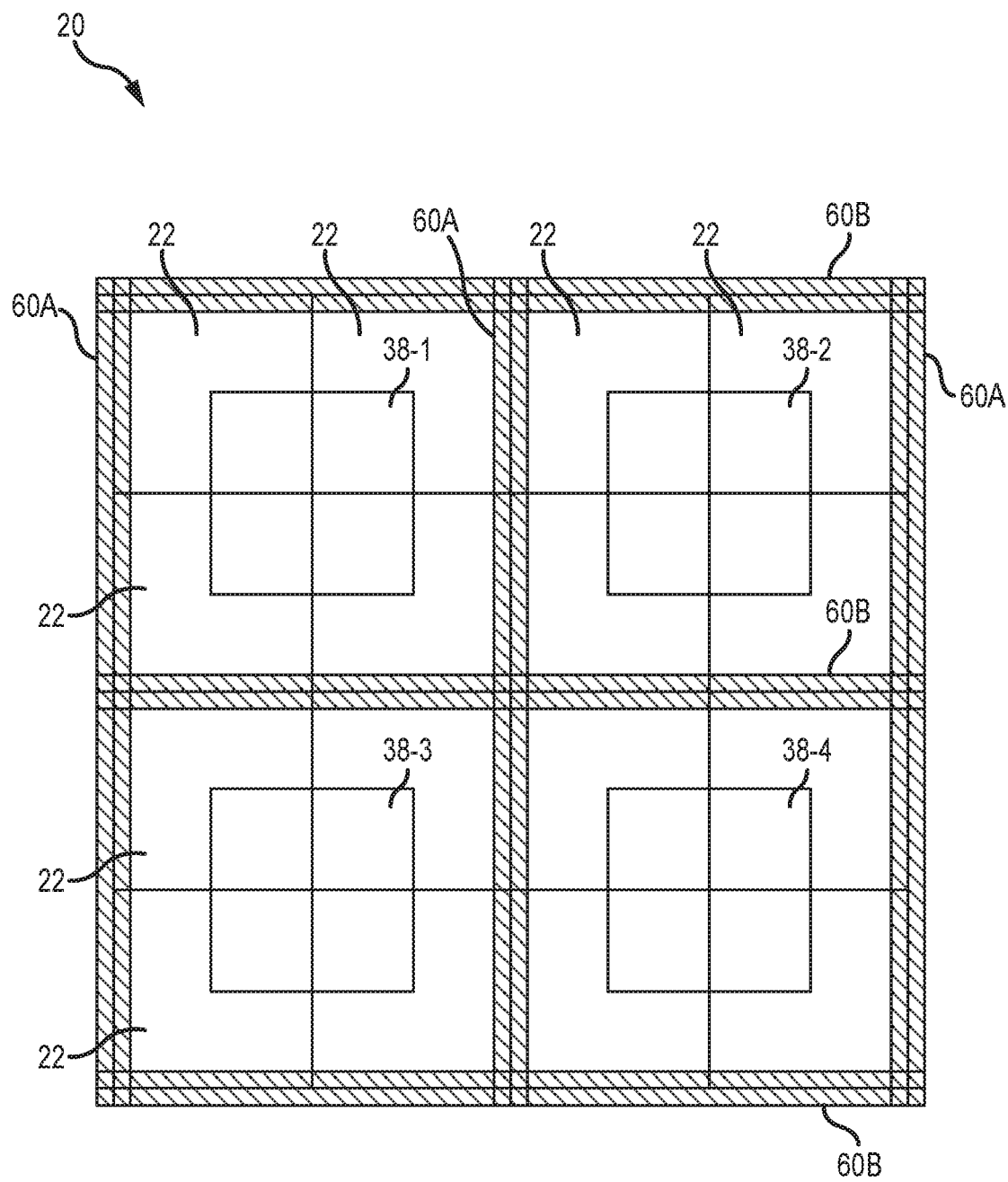
FIG. 10 is a top-down view of a pixel array with shielding structures formed between groups of pixels in accordance with an embodiment of the present invention.

FIG. 10 is a top-down view of a portion of pixel array 20 with pixels 22 arranged in 4 2×2 pixel clusters. Each 2×2 pixel cluster may share a single coupling structure 38. For example, coupling structure 38-1 may be shared by a first group of four pixels 22, coupling structure 38-2 may be shared by a second group of four pixels 22, coupling structure 38-3 may be shared by a third group of four pixels 22, coupling structure 38-4 may be shared by a fourth group of four pixels 22, etc. As described earlier in connection with FIG. 2, pixel array 20 may include pixels 22 arranged in rows and columns. Similarly, coupling structures 38 may be arranged in rows and columns. In the example of FIG. 10, coupling structures 38-1 and 38-2 are arranged in a first row, coupling structures 38-3 and 38-4 are arranged in a second row, coupling structures 38-1 and 38-3 are arranged in a first column, and coupling structures 38-2 and 38-4 are arranged in a second column.

The shared coupling structure arrangement of FIG. 10 may be implemented using any of the split-pixel architectures of FIGS. 4-9. For example, each pixel 22 may include a photodiode (e.g., photodiode 62 of FIGS. 5-9) in a first integrated circuit die (e.g., upper integrated circuit die 34 of FIGS. 5-9). The four photodiodes in each 2×2 pixel cluster may be electrically coupled to a shared row select transistor (e.g., row select transistor 56 of FIGS. 5-9) in a second integrated circuit die (e.g., lower integrated circuit die 36 of FIGS. 5-9) via a shared coupling structure 38. Other pixel circuitry in each pixel 22 may be split between the upper and lower integrated circuit dies according to one of the arrangements shown in FIGS. 5-9 or using any other suitable split-pixel architecture.

During operation of image sensor 16, image sensor 16 may operate in a rolling shutter readout so that the pixels 22 in the first row of coupling structure 38 (e.g., pixels 22 that are coupled to coupling structure 38-1 and pixels 22 that are coupled to coupling structure 38-2) are readout before pixels 22 in the second row (e.g., pixels 22 are coupled to coupling structure 38-3 and pixels 22 that are coupled to coupling structure 38-4). It should be noted that the embodiment shown in FIG. 10 is merely illustrative. If desired, conductive structure 38 may be coupled to any number of pixels 22 (e.g., two pixels, six pixels, eight pixels, etc.) or may be coupled to only one pixel 22.

To prevent coupling between adjacent coupling structures 38, shielding structures 60 may be formed between adjacent coupling structures 38. Shielding structures 60 may, for example, include vertical shielding 60A and/or horizontal shielding 60B. Vertical metal shielding 60A may be formed between adjacent columns of coupling structures (e.g., to prevent coupling between coupling structures 38-1 and 38-2 and between coupling structures 38-3 and 38-4). Horizontal shielding 60B may be formed between adjacent rows of coupling structures (e.g., to prevent coupling between coupling structures 38-1 and 38-3 and between coupling structures 38-2 and 38-4). If desired, shielding 60 may be a metal wire that is connected to ground and that has a controlled voltage. Metal shielding 60 may only be formed between columns of coupling structures 38, may only be formed between rows of coupling structures 38, or may be formed between both rows and columns of coupling structures 38.

Figure 11:
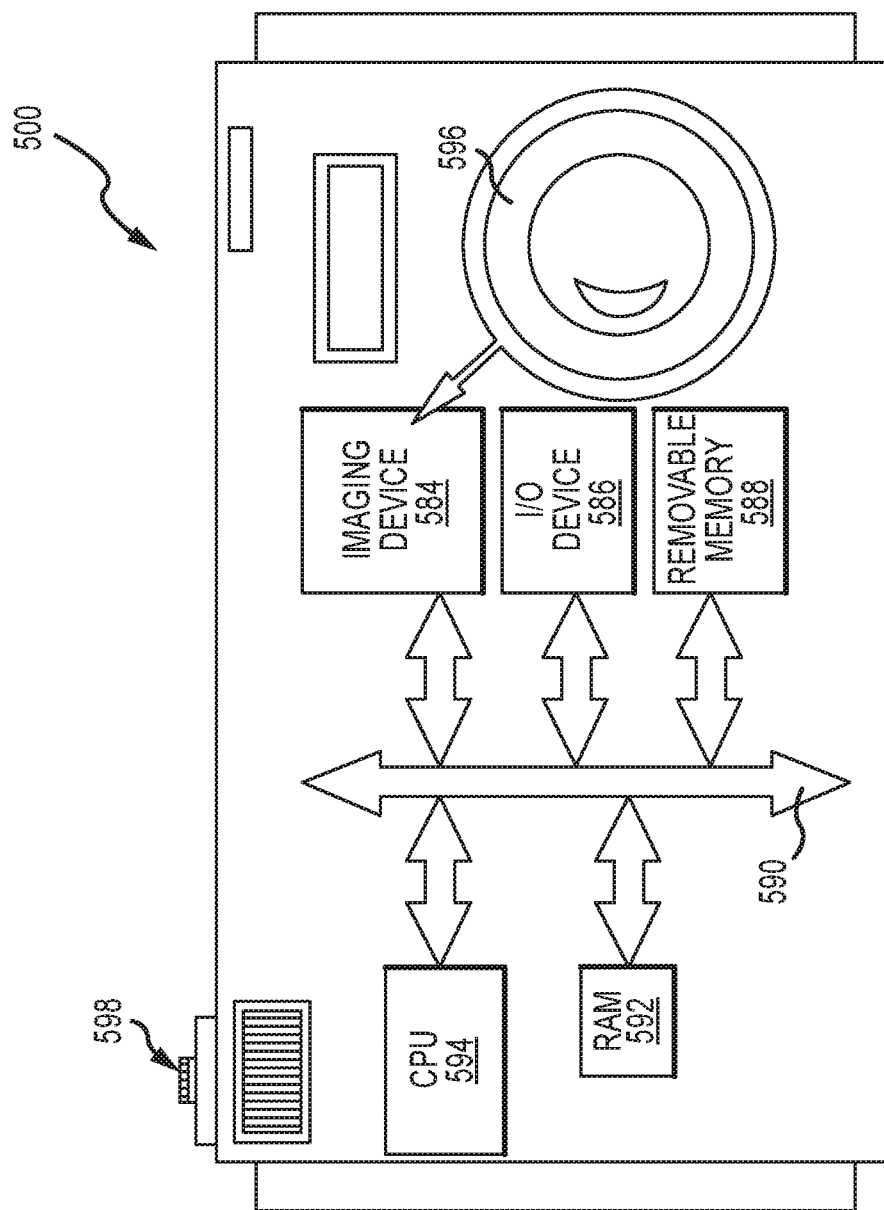
FIG. 11 is a block diagram of an illustrative processor system that may employ the embodiments of FIGS. 1-10 in accordance with an embodiment of the present invention.

FIG. 11 shows in simplified form a typical processor system 500. Processor system 500, which may be a digital still or video camera system may include a lens such as lens 596 for focusing an image onto a pixel array such as pixel array 20 when shutter release button 598 is pressed. Processor system 500 may include a central processing unit such as central processing unit (CPU) 594. CPU 594 may be a microprocessor that controls camera functions and one or more image flow functions and communicates with one or more input/output (I/O) devices 586 over a bus such as bus 590. Imaging device 584 may also communicate with CPU 594 over bus 590. System 500 may include random access memory (RAM) 592 and removable memory 588. Removable memory 588 may include flash memory that communicates with CPU 594 over bus 590. Although bus 590 is illustrated as a single bus, it may be one or more buses or bridges or other communications paths used to interconnect the system components.

Various embodiments have been described illustrating an image sensor with an array of image pixels. The image sensor may include a first die and second die which are stacked on top of each other and coupled together using a conductive structure such as a metal pad. Each pixel may include circuitry formed in the first die and circuitry formed in the second die. For example, each pixel may include a photodiode formed in the first die and associated readout circuitry such as a row select transistor and a source follower transistor in the second die. Charge gathered by the photodiode in the first die may be transferred to the readout circuitry in the second die via the conductive pad between the first and second dies.

To reduce parasitic coupling between adjacent conductive pads, shielding may be formed that completely or partially surrounds each conductive pad. This shielding may be a metal wire that is electrically connected to a ground voltage. This shielding may be formed between columns of pixels, may be formed between rows of pixels, or may be formed between both rows and columns of pixels to form a grid of shielding.

The foregoing is merely illustrative of the principles of this invention and various modifications can be made by those skilled in the art. The foregoing embodiments may be implemented individually or in any combination.

What is claimed is:

1. An array of image pixels, comprising:
   first and second image pixels each including:
      a photosensitive element in a first integrated circuit die,
      a floating diffusion region in the first integrated circuit die,
      a first transistor that couples the photosensitive element to the floating diffusion region,
      a source follower transistor that is coupled to the floating diffusion region and disposed in the first integrated circuit die,
      a row select transistor in a second integrated circuit die, the second integrated circuit die stacked on the first integrated circuit die, and
      a pixel output line coupled to the row select transistor, the pixel output line disposed in the second integrated circuit die; and
   a shared coupling structure at an interface of the first and second integrated circuit dies associated with the first and second image pixels, wherein the shared coupling structure is coupled to the source follower transistor in the first image pixel and is coupled to the source follower transistor in the second image pixel.

2. The array of image pixels defined in claim 1, further comprising a third image pixel coupled to the shared coupling structure.

3. The array of image pixels defined in claim 2, further comprising a fourth image pixel coupled to the shared coupling structure, wherein the first, second, third, and fourth image pixels are arranged in a two-by-two cluster.

4. The array of image pixels defined in claim 1, further comprising a shielding structure that separates the shared coupling structure from an additional shared coupling structure.

5. The array of image pixels defined in claim 4, wherein the shielding structure is connected to a controlled voltage.

6. The array of image pixels defined in claim 1, further comprising:
   a plurality of additional image pixels; and
   a plurality of additional shared coupling structures, the plurality of additional shared coupling structures each shared by a corresponding set of image pixels in the plurality of additional image pixels.

7. The array of image pixels defined in claim 6, wherein the shared coupling structure and the plurality of additional shared coupling structures are arranged in rows and columns of coupling structures in a plan view.

8. The array of image pixels defined in claim 7, further comprising:
   a vertical shielding that runs along the columns of coupling structures in the plan view; and
   a horizontal shielding that runs along the rows of coupling structures in the plan view.

* * * * *